US 6,986,110 B1

(12) United States Patent
Thompson et al.

(10) Patent No.: US 6,986,110 B1
(45) Date of Patent: Jan. 10, 2006

(54) AUTOMATED METHOD AND SYSTEM FOR BACKTRACING OF INSTRUCTION PARAMETERS FROM SPECIFIED INSTRUCTION IN TEST CASES

(75) Inventors: Ryan C. Thompson, Loveland, CO (US); John W. Maly, LaPorte, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 471 days.

(21) Appl. No.: 10/336,383

(22) Filed: Jan. 2, 2003

(51) Int. Cl.
*G06F 17/50* (2006.01)
*G06F 17/30* (2006.01)
*G06F 9/44* (2006.01)
*G06F 9/40* (2006.01)
*G06F 9/30* (2006.01)

(52) U.S. Cl. .............................. 716/4; 716/18; 703/16; 703/26; 703/27; 703/28; 717/128; 717/135; 707/4; 707/5; 707/6

(58) Field of Classification Search .................... 716/4, 716/18; 703/16, 26, 27, 28; 717/128, 135; 707/4–6, 7
See application file for complete search history.

(56) References Cited

U.S. PATENT DOCUMENTS

| | | | | |
|---|---|---|---|---|
| 3,707,725 A | * | 12/1972 | Dellheim ...................... 714/38 |
| 4,068,298 A | * | 1/1978 | Dechant et al. ................. 707/3 |
| 4,819,233 A | * | 4/1989 | Delucia et al. .............. 717/129 |
| 5,317,740 A | * | 5/1994 | Sites .......................... 717/129 |
| 5,339,238 A | * | 8/1994 | Benson ....................... 717/159 |
| 5,633,813 A | * | 5/1997 | Srinivasan ................... 703/14 |
| 5,666,528 A | * | 9/1997 | Thai ........................... 707/102 |
| 5,819,064 A | * | 10/1998 | Razdan et al. ................. 703/27 |
| 5,842,017 A | * | 11/1998 | Hookway et al. ............ 717/158 |
| 5,963,739 A | * | 10/1999 | Homeier ...................... 717/126 |
| 5,974,248 A | * | 10/1999 | Graef .......................... 703/22 |
| 6,006,028 A | * | 12/1999 | Aharon et al. ................. 703/21 |
| 6,021,271 A | * | 2/2000 | Winter et al. ................. 703/14 |
| 6,029,002 A | * | 2/2000 | Afifi et al. .................... 717/131 |
| 6,163,876 A | * | 12/2000 | Ashar et al. .................... 716/5 |
| 6,212,667 B1 | * | 4/2001 | Geer et al. ...................... 716/6 |
| 6,247,164 B1 | * | 6/2001 | Ashar et al. .................... 716/5 |
| 6,263,489 B1 | * | 7/2001 | Olsen et al. ................. 717/129 |
| 6,332,211 B1 | * | 12/2001 | Pavela ......................... 717/130 |
| 6,421,822 B1 | * | 7/2002 | Pavela ......................... 717/125 |
| 6,434,553 B1 | * | 8/2002 | Sekiguchi et al. ............. 707/4 |
| 6,519,765 B1 | * | 2/2003 | Kawahito et al. ............ 717/127 |
| 6,546,524 B1 | * | 4/2003 | Chankramath et al. ........ 716/4 |
| 6,578,028 B2 | * | 6/2003 | Egilsson et al. .............. 707/12 |
| 6,634,017 B2 | * | 10/2003 | Matsui et al. ................. 716/11 |
| 6,658,651 B2 | * | 12/2003 | O'Brien et al. ............. 717/127 |
| 6,698,011 B1 | * | 2/2004 | Reinders et al. ............ 717/124 |
| 6,704,925 B1 | * | 3/2004 | Bugnion ..................... 717/138 |
| 6,745,160 B1 | * | 6/2004 | Ashar et al. ................. 703/14 |
| 6,754,612 B1 | * | 6/2004 | Vanfladern et al. ......... 702/186 |
| 6,760,889 B2 | * | 7/2004 | Kawamoto .................... 716/3 |
| 6,782,518 B2 | * | 8/2004 | Decker ........................... 716/5 |
| 6,851,089 B1 | * | 2/2005 | Erickson et al. ............ 715/513 |
| 2002/0032559 A1 | * | 3/2002 | Hellestrand et al. .......... 703/22 |

(Continued)

*Primary Examiner*—Matthew Smith
*Assistant Examiner*—Phallaka Kik

(57) ABSTRACT

Method and system for automatically backtracing through a testcase file. First the testcase file is accessed. Next, a start line identifier for specifying an instruction line in the testcase file at which to begin processing is received. The instruction line in the testcase file that is specified by the start line identifier is processed first. The previous instruction lines in the testcase file are then processed in a sequential fashion until the beginning of the testcase file is reached.

15 Claims, 4 Drawing Sheets

U.S. PATENT DOCUMENTS

| | | | |
|---|---|---|---|
| 2002/0083033 A1 * | 6/2002 | Abdo et al. | 707/1 |
| 2003/0005393 A1 * | 1/2003 | Kawamoto | 716/3 |
| 2003/0145307 A1 * | 7/2003 | Jahnke | 717/106 |
| 2003/0204819 A1 * | 10/2003 | Matsumoto et al. | 716/1 |
| 2003/0204839 A1 * | 10/2003 | Kawahito et al. | 717/130 |
| 2004/0059725 A1 * | 3/2004 | Sharangpani et al. | 707/3 |
| 2004/0088666 A1 * | 5/2004 | Poznanovic et al. | 716/7 |
| 2004/0088691 A1 * | 5/2004 | Hammes et al. | 717/158 |
| 2004/0148150 A1 * | 7/2004 | Ashar et al. | 703/14 |
| 2004/0216092 A1 * | 10/2004 | Ayers et al. | 717/135 |

* cited by examiner

AUTOMATED METHOD AND SYSTEM FOR BACKTRACING OF INSTRUCTION PARAMETERS FROM SPECIFIED INSTRUCTION IN TEST CASES

FIELD OF THE INVENTION

The present invention relates generally to test case generators, and more particularly, an automated method and system for backtracing of instruction parameters from a specified instruction in test cases.

BACKGROUND OF THE INVENTION

As is known in the art, a computer system generally includes a central processing unit (CPU), which is referred to herein simply as "processor", a memory system, a cache system, and an I/O system. These systems are coupled together through various busses. The CPU, which may be constructed of a single chip or multiple chips, also generally includes an arithmetic logic unit (ALU), floating point unit (FPU), a program counter, a plurality of high speed memory locations known as registers, a memory controller for reading from and writing to memory, and control logic for fetching instructions from memory. Moreover, the CPU includes circuitry for executing the instructions fetched from memory.

Once a computer system has been designed, system designers need to verify the operation of the CPU. The verification is performed to ensure that the CPU operates as designed. Furthermore, verification is performed to ensure that the CPU interfaces properly with each of the elements described above. As can be appreciated, this process of verifying the design of a central processing unit (CPU) is important in developing a successful microprocessor product.

In order to verify that each element of the newly designed computer system functions properly, system verification engineers create a computer model of the CPU chip. In addition, models are created for each of the subsystem elements that provide stimulus to the CPU model. Each element in the system has a unique model which represents its operation in the form of its response to input stimulus. The models can be created using specialized programming languages developed solely for that purpose, or they can be created using general purpose programming languages, such as the C programming language or the C++ programming language.

Since the CPU is the heart of most computer systems, the model of the CPU is typically the most complex and sophisticated. In order to properly verify the functionality of the CPU, various stimuli are applied to the model. The response of the model to the various stimuli is recorded and analyzed by a verification engineer.

In order to sufficiently test the CPU, the model must be exercised as extensively as possible. One prior art method of testing a CPU design involves manually written tests. These tests are typically written by system verification engineers, who select the type of stimuli to be applied to the CPU model. These manually written tests include only the test stimuli, which the engineer believes are appropriate for the CPU model. In addition to creating the test stimulus program, the engineer also needs to design a method of checking the results generated by the CPU model in response to the applied stimulus.

Another prior art method of creating verification test programs involves the use of random test file generators. A random test file generator is a program that has knowledge of each possible command that can be executed by the CPU. The random test file generator also has knowledge of possible delays or hand shaking methods that are used when the CPU communicates with other subsystems. The random test file generator randomly selects, from each of the parameters of which it has knowledge, operations to be performed by the CPU model, thereby creating randomly generated test files or test programs that may be applied to the CPU model.

One advantage of using random test generators is that the random test generators tend to provide far more complete tests in a shorter time frame than the manually written test programs described previously. In addition, random test generators can create combinations of various stimuli that a system verification engineer may overlook or be unaware of.

There are various ways in which the test files created by random test generators may be used to verify designs. One method is to apply the same test files to the design to be verified and an abstract representation of the design known as the reference model. The results of each test file application are recorded and manually compared. Any mismatches in the recorded results are manually flagged as problems and used to further diagnose the design.

Prior art methods of checking a design against a reference model have been performed manually by a verification engineer, which tended to make the comparison process labor intensive and expensive.

In a perfect world, testcases would not fail due to incorrect values. However, in the real world, since testcases can fail due to incorrect values, the debugging of testcases is an important component of the design verification process.

For example, a load instruction may be executed correctly. However, if the address register did not contain a value that a random code generator expected, a translation lookaside buffer (TLB) miss fault can occur. The verification engineer must then manually search the instruction code flow in an iterative fashion to determine the most recent instruction that affects the value. This process is repeated until the origin of the value is determined.

When an incorrect value causes a randomly-generated testcase to fail, a verification engineer is required to determine what exactly caused the incorrect value. The verification engineer typically employs the process of backtracing to determine the cause of the incorrect value.

Backtracing is the manual process of going through the flow of instructions to determine where values originate. This backtracing process is an iterative process that goes back through the instruction flow to find the most chronologically recent instruction that affect a value in question. The iterative process is repeated until the source of a particular value is located.

As can be appreciated, when many instructions are present, this iterative process is time consuming and labor intensive. Accordingly, prior art methods for manually performing backtracing are severely limited in terms of efficiency.

Based on the foregoing, there remains a need for an automated method and system for backtracing of instruction parameters from specified instruction in test cases that overcomes the disadvantages of the prior art as set forth previously.

SUMMARY OF THE INVENTION

According to one embodiment of the present invention, an automated method and system for backtracing of instruction parameters from a specified instruction in test cases is described.

According to one embodiment of the present invention, a method for automatically backtracing through a testcase file is described. First, the testcase file is accessed. Next, a start line identifier for specifying an instruction line in the testcase file at which to begin processing is received. The instruction line in the testcase file that is specified by the start line identifier is processed first. The previous instruction lines in the testcase file are then processed in a sequential fashion until the beginning of the testcase file is reached.

Other features and advantages of the present invention will be apparent from the detailed description that follows.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

The automated backtracing system and method according to the invention can be implemented in hardware, software, firmware, or a combination thereof. In one embodiment, the invention is implemented using hardware. In another embodiment, the invention is implemented using software that is executed by general purpose or an application specific processor.

In yet another alternative implementation, embodiments of the invention may be implemented using a combination of hardware and software that is stored in a memory and that is executed by a suitable instruction execution system.

The hardware portion of the invention can be implemented with one or more of the following well-known technologies: discrete logic circuits that include logic gates for implementing logic functions upon data signals, application specific integrated circuit (ASIC), a programmable gate array(s) (PGA), and a field-programmable gate array (FPGA).

The software portion of the invention can be stored in one or more memory elements and executed by a suitable general purpose or application specific processor. The program for processing packets, which comprises an ordered listing of executable instructions for implementing logical functions, can be embodied in any computer-readable medium for use by or in connection with an instruction execution system or apparatus (e.g., a computer-based system, a processor-based system, or other system that can fetch and execute the instructions).

Testing System 100

Figure 1:
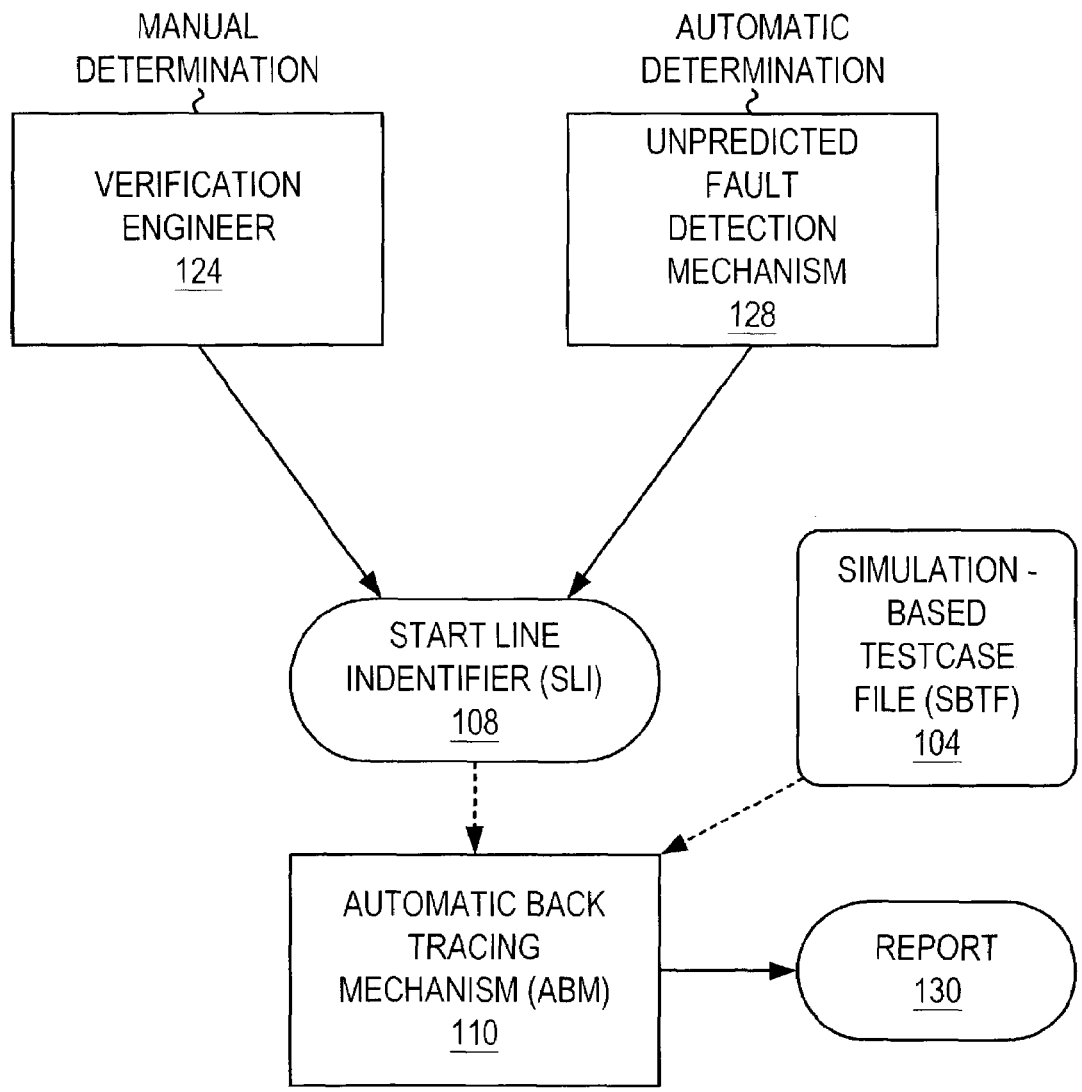
FIG. 1 illustrates a testing system in which the automated backtracing mechanism according to one embodiment of the present invention can be implemented.

FIG. 1 illustrates a testing system 100 in which the automated backtracing mechanism (ABM) 110 according to one embodiment of the present invention can be implemented. The system 100 includes a simulation-based testcase file (SBTF) 104 that includes a plurality of instructions. The simulation-based testcase file (SBTF) 104, for example, can be automatically generated by a testcase generator that has an integrated instruction simulator.

The simulation-based testcase file (SBTF) 104 differs from other testcase files in that the simulation-based testcase file (SBTF) 104 includes a list of instructions that are arranged in an expected execution order. In this manner, the instructions in the simulation-based testcase file (SBTF) 104, including branch instructions, and faults or exceptions, are predicted by the instruction simulator and listed in the simulation-based testcase file (SBTF) 104 in the expected execution order. A portion of an exemplary testcase file (SBTF) 104 is set forth in TABLE I.

TABLE I

PORTION OF EXEMPLARY TESTCASE FILE

| Address | Instruction | Inputs | Outputs |
|---|---|---|---|
| ... | | | |
| 0000000006b10170 | load | r35 r6 | r24 |
| ... | | | |
| 0000000006b10040 | shiftL add | r3 r24 | r15 |
| ... | | | |
| 000000000c06d434 | mov | b0 | r4 |
| 000000000c06d438 | branch | b6 | |
| 0000000006b10080 | purge | r45 r133 | |
| 0000000006b10084 | move long | | |
| 0000000006b10090 | store fault:dtlb | r15 | |
| 000000000c068800 | move | cr.ifa | r16 |
| 000000000c068804 | hash | r16 | r17 |
| 000000000c068808 | deposit | r16 | r16 |
| 000000000c068810 | no-op | | |

The system 100 also includes a source for generating a start line identifier (SLI) 108 for identifying a particular instruction in the simulation-based testcase file (SBTF) 104 to begin backtracing processing. The start line identifier (SLI) 108 can be manually determined by a verification engineer 124, for example, or automatically determined by an unpredicted fault detection mechanism 128, for example.

The system 100 also includes the automated backtracing mechanism 110 according to the invention. The automated backtracing mechanism 110 receives the SLI 108 and has access to the SBTF 104. Based on these inputs, the automated backtracing mechanism 110 according to the invention generates a report 130 that contains information useful to a verification engineer. When implemented as a script of programming instructions denoted "backtrace", the inputs to the script can be those set forth in TABLE II. Exemplary pseudo-code for the backtrace script is set forth in TABLE IV.

TABLE II

INPUTS backtrace <testcasefile> <linenumber>
<testeasefile> is the test case file
<linenumber> is the line number in the test case file at which to begin backtracing.

The report 130 generated by the automated backtracing mechanism 110 according to the invention improves the efficiency in the analysis and debugging of testcases over prior art techniques that use a manual iterative search. Specifically, the automated backtracing mechanism 110 according to the invention automatically backtraces the parameters of a particular instruction in order to determine the possible sources of values of the parameters, and generates the report 130 that contains this information.

Automated Backtracing Mechanism

Figure 2:
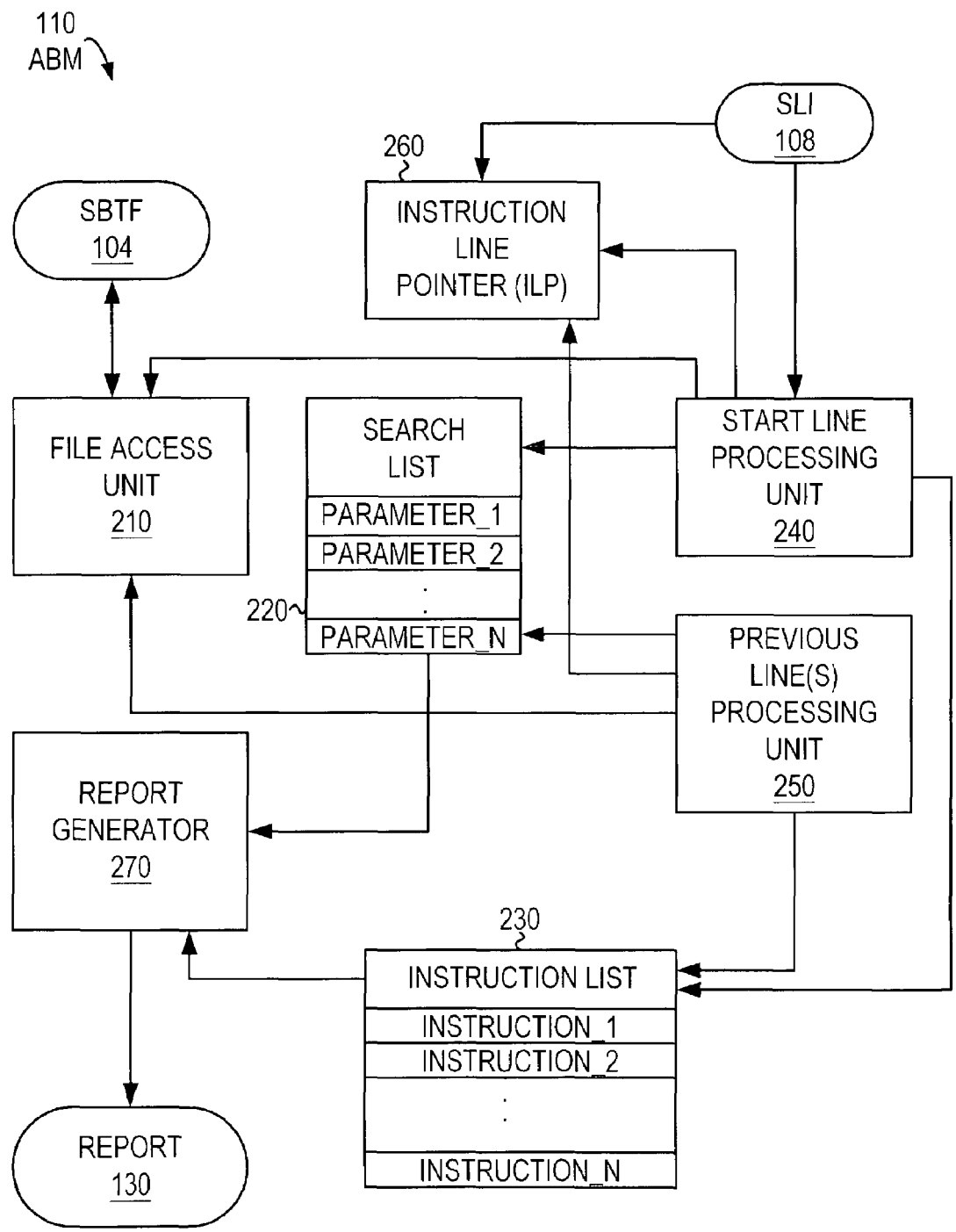
FIG. 2 is a block diagram illustrating in greater detail the automated backtracing mechanism of FIG. 1 in accordance with one embodiment of the present invention.

FIG. 2 is a block diagram illustrating in greater detail the automated backtracing mechanism 110 of FIG. 1 in accordance with one embodiment of the present invention. One novel aspect of the automated backtracing mechanism (ABM) 110 according to the invention is to provide an automated backtracing process so that the source of a value of a particular instruction can be automatically found without the need for manual effort on the part of a verification engineer.

The automated backtracing mechanism (ABM) 110 includes a file access unit 210 for accessing the SBTF 104. The file access unit 210 can, for example, perform the following functions: 1) opening the SBTF 104, 2) closing the SBTF 104, and 3) reading information from the SBTF 104.

The automated backtracing mechanism (ABM) 110 also includes a search list 220 and an instruction list 230. The search list 220 includes one or more parameters (e.g., parameter_1, parameter_2, parameter_n) that are currently utilized as search parameters by the ABM 110 in evaluating instructions in the SBTF 104. The instruction list 230 includes a list of instructions (e.g., instruction_1, instruction_2 instruction_n) that are to be included in the report 130. When instructions meet a predetermined criterion, the instruction is added to the instruction list 230. How the search list 220 and the instruction list 230 are updated and maintained is described in greater detail hereinafter.

The automated backtracing mechanism 110 also includes a start line processing unit 240 for processing the start instruction line and a previous line(s) processing unit 250 for processing previous instruction lines. An instruction line pointer (ILP) 260 is provided for tracking a current instruction line in the SBTF 104 that is being processed by either the start line processing unit 240 or the previous line(s) processing unit 250.

The start line processing unit 240 receives the SLI 108 and processes the instruction line identified by the SLI 108. For example, the instruction line pointer (ILP) 260 can be initially assigned the SLI 108 value. Parameters are extracted from the instruction line and added to the search list. The instruction line is also added to the instruction list 230. Once processing is complete, the start line processing unit 240 decrements the instruction line pointer (ILP) 260 so that the ILP 260 points to a previous instruction (i.e., the instruction immediately preceding the start instruction in the SPTF 104).

The previous line(s) processing unit 250 evaluates the previous instruction and selectively deletes and adds parameters to the search list 220. For example, parameters in the search list 220 that are modified by the current instruction are deleted from the search list 220. However, the parameters in the current instruction that modify the deleted parameter are added to the search list 220. The previous line(s) processing unit 250 also selectively adds previous instructions to the instruction list 230 based on a predetermined criterion. The predetermined criterion can be, for example, whether the current instruction modifies at least one parameter currently listed in the search list 220.

Once processing is complete for the current instruction line, the previous line processing unit 240 decrements the instruction line pointer (ILP) 260 so that the ILP 260 points to a previous instruction (i.e., the instruction immediately preceding the start instruction in the SPTF 104). Each previous instruction is processed in a similar fashion until the beginning of the testcase file is reached (e.g., when the ILP 260 is equal to one).

The operation of the start line processing unit 240 and the operation of the previous line(s) processing unit 250 are described in greater detail hereinafter with reference to FIG. 3 and FIG. 4.

The automated backtracing mechanism 110 also includes a report generator 270 for generating a report 130 that contains information useful for debugging and analysis. The report generator 270 generates a report 130 that includes the instruction list 230 and the current parameters in the search list 220. An exemplary report 130 is set forth in TABLE III.

Automated Backtracing Processing—First Embodiment

Figure 3:
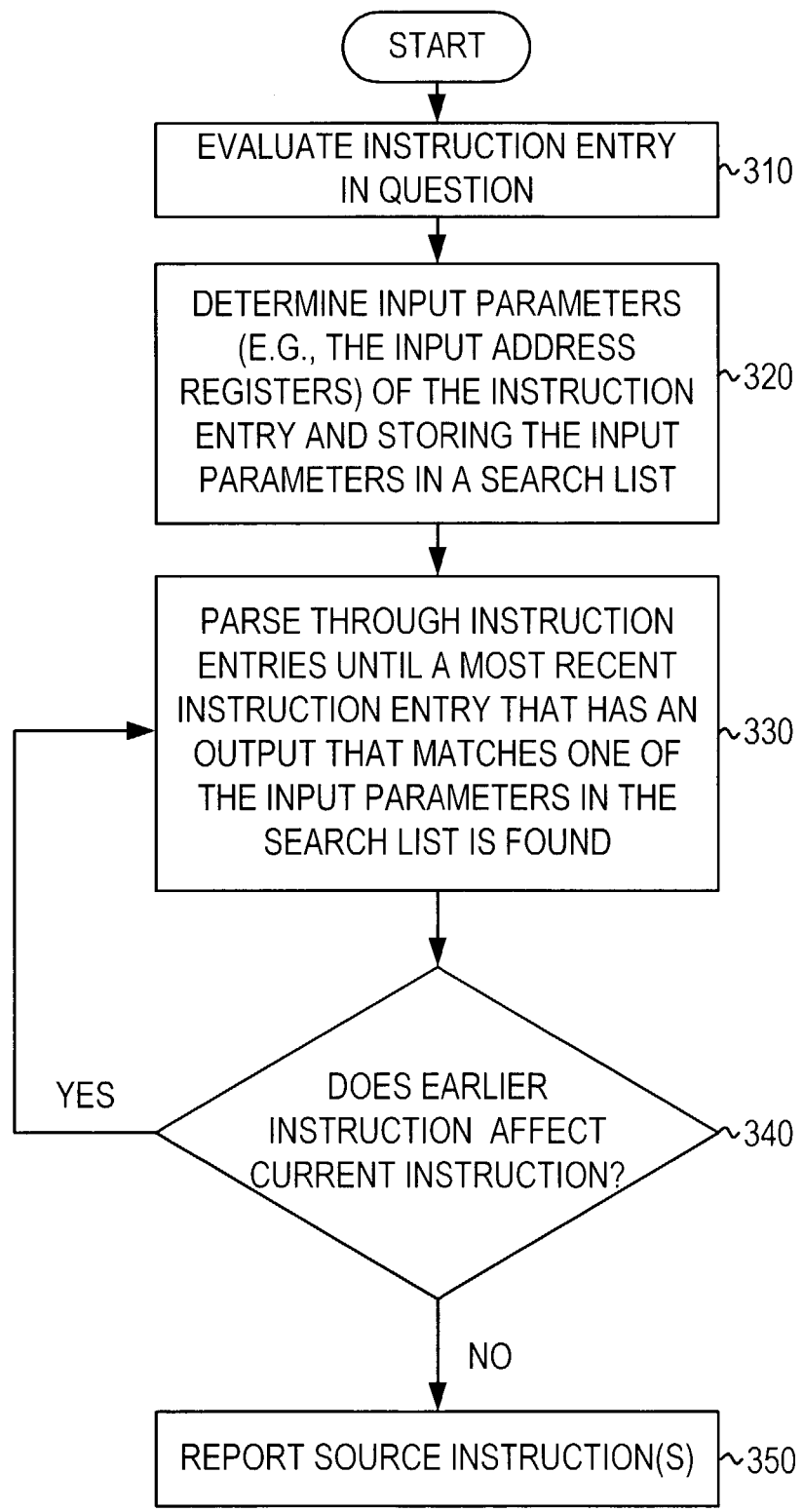
FIG. 3 is a flow chart illustrating the steps performed by the automated backtracing mechanism in accordance with one embodiment of the present invention.

FIG. 3 is a flow chart illustrating the steps performed by the automated backtracing mechanism in accordance with one embodiment of the present invention. In step 310, the instruction entry in question is evaluated. The instruction entry in question may be specified by a start line identifier. The start line identifier may be determined manually by a verification engineer or automatically by employing the techniques described in following copending patent application Ser. No. 10/336,454, entitled "AUTOMATED METHOD AND SYSTEM FOR DETECTING UNPREDICTED FAULT OCCURRENCES IN TEST CASES" by inventors Ryan C. Thompson and John W. Maly, which is filed concurrently herewith on Jan. 2, 2003 and which is hereby incorporated herein by reference.

In step 320, the input parameters (e.g., the input address registers) of the instruction entry in question are determined and stored in a search list. In step 330, the instruction entries are parsed through until a most recent instruction entry is found that has as an output, which matches one of the input parameters in the search list. For example, when an output or destination address register matches one of the input parameters specified by the search list (e.g., a register specified in the search list 220), the current instruction entry is processed.

In determination block 340, a determination is made whether an earlier instruction affects the current found instruction. When an earlier instruction affects the current instruction, processing continues at processing step 330. When an earlier instruction does not affect the current instruction, one or more source instructions are reported in step 350.

For example, referring to TABLE I, it is determined either manually by a verification engineer or automatically that the DTLB fault predicted at address 0000000006b10090 is not taken by the simulators (e.g., the architectural simulator and the RTL model simulator). Further, the user (e.g., a verification engineer) has determined that the fault was not taken as expected because the value of R15 (which is a general register) expected by the testcase is different from the actual value of R15 generated by the simulators.

In prior art approaches, a user must manually determine the possible sources of failure by manually backtracing from the fault to the beginning of the testcase file.

The automatic backtracing mechanism according to the invention automatically searches backward in the testcase file from the start instruction. The automatic backtracing mechanism according to the invention automatically determines that r15 was written to last by a shiftL add (shift-left and add) instruction at address 6b10040. The parameters of the shift-left and add instruction are r3 and r24.

The automatic backtracing mechanism according to the invention continues to search backward through the testcase file for r3 and r24. The automatic backtracing mechanism according to the invention automatically determines that r24 is written by a load instruction at address 6b10170. The parameters to the load instruction are r35 and r6. The automatic backtracing mechanism according to the invention continues to search backward for r3, r35, and r6 until the beginning of the testcase file 104 is reached. The values for r3, r35, and r6 are not found.

Based on this automatic backtracing, the automatic backtracing mechanism according to the invention generates a report that provides the following information:

The initial values of r3, r35, or r6.
The load instruction at address 6b10170
The shiftL add instruction at address 6b10040

Based on this information, a verification engineer can determine that one of the above locations or places is the source of the failure.

The automated backtracing mechanism according to the invention automates the backward searching of the testcase instruction list and reports a list of possible failure locations.

TABLE III

EXEMPLARY OUTPUT REPORT

| instructions: | | | |
|---|---|---|---|
| 0000000006b10170 | load | r35 r6 | r24 |
| 0000000006b10040 | shiftL add | r3 r24 | r15 |
| 0000000006b10090 | store | r15 | |
| initial values: | | | |
| _r003: | data8 | 0x177297d0a67dff70 | |
| _r006: | data8 | 0x6d5591fa93a56f88 | |
| _r035: | data8 | 0xc938e43a19ac9ff0 | |

Automated Backtracing Processing—Second Embodiment

Figure 4:
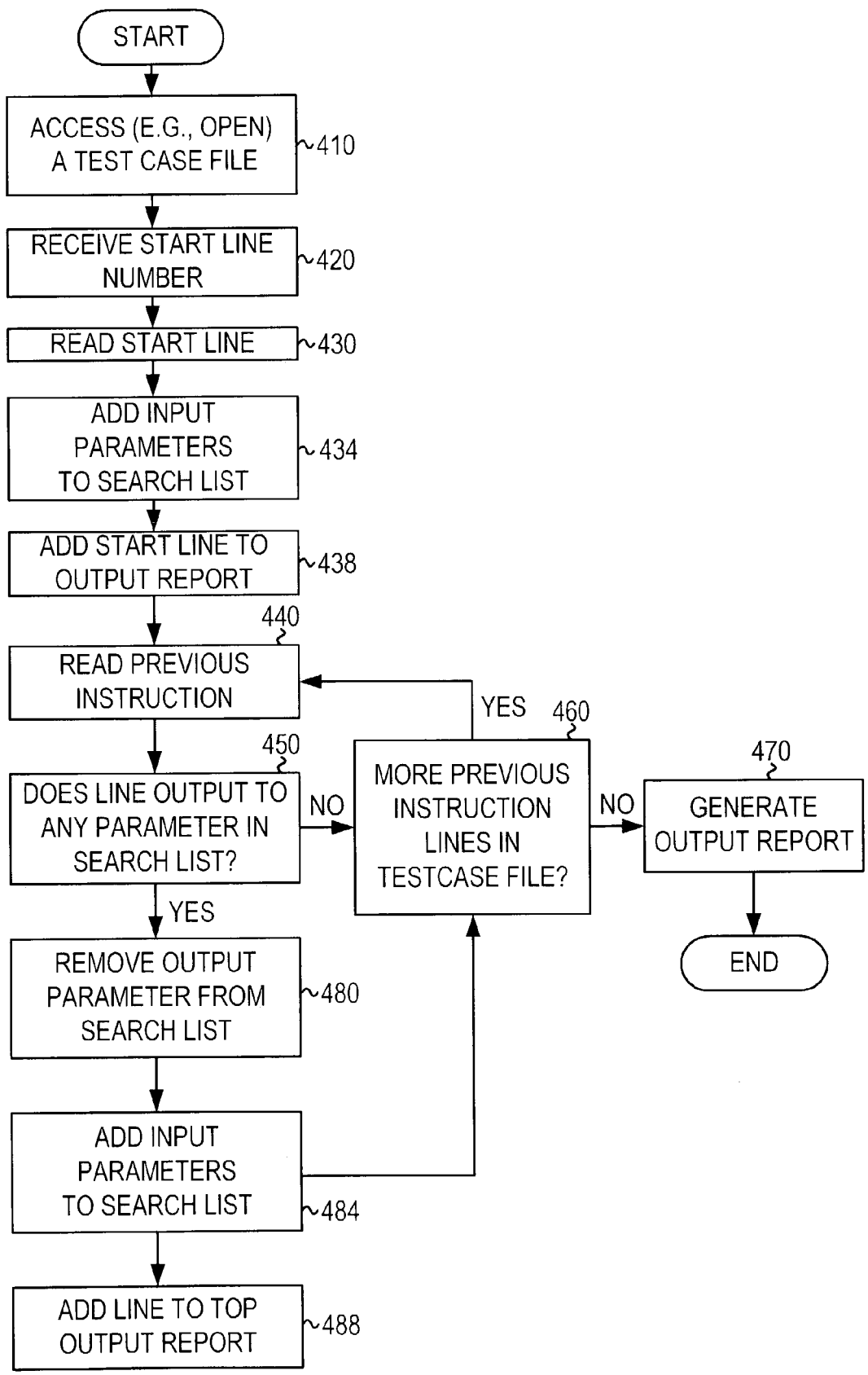
FIG. 4 is a flow chart illustrating the steps performed by the automated backtracing mechanism in accordance with another embodiment of the present invention.

FIG. 4 is a flow chart illustrating the steps performed by the automated backtracing mechanism in accordance with another embodiment of the present invention. In step 410, a testcase file is accessed. This step can include the step of opening the testcase file. In step 420, a start line identifier (e.g., a start line number) is received. In one example, the start line identifier specifies the line in the testcase file that causes an unpredicted fault (e.g., an fault expected by the testcase that is not taken by the RTL model simulator and architectural simulator or a fault not expected by the testcase but is taken by the RTL model simulator and architectural simulator). In this example, the start line identifier specifies the instruction line that immediately precedes the fault in the testcase.

The start line identifier (e.g., start line number) may be manually determined by a verification engineer or automatically determined by employing the techniques described in following copending patent application, Ser. No. 10/336,454, entitled "AUTOMATED METHOD AND SYSTEM FOR DETECTING UNPREDICTED FAULT OCCURRENCES IN TEST CASES" by inventors Ryan C. Thompson and John W. Maly, which is filed concurrently herewith on Jan. 2, 2003 and which is hereby incorporated herein by reference.

In step 430, the start line in the testcase file is read. In step 434, the input parameters of the start line are added to a search list. In step 438, the start line is added to an output report (e.g., the top of the output report). In step 440, a previous instruction line is read. In step 450, a determination is made whether the previous instruction line outputs to any parameter in the search list. When the previous instruction line does not output to any parameter in the search list (e.g., the instruction in the previous instruction line does not write or modify any parameter in the search list), in step 460, a determination is made whether there are more previous instruction lines in the testcase file. When there are more previous instruction lines in the testcase file, processing proceeds to step 440, where another previous instruction line is read from the testcase file. Processing continues in the loop 440, 450, 460, 440 until the beginning of the testcase file is reached.

When there are no more previous instruction lines in the testcase file, processing proceeds to step 470, where an output report is generated. For example, the output report can include, but is not limited to, 1) the instructions lines that affect (e.g., modify) the input parameters of the start instruction line and 2) the initial values of parameters currently in the search list.

When the previous instruction line does output to one or more parameters in the search list (e.g., the instruction in the previous instruction line writes or modifies one or more parameters in the search list), in step 480, the output parameter of the instruction line is removed from the search list. For example, the output parameter in the search list that was modified by the previous instruction line is removed from the search list. In step 484, the input parameters of the instruction line are added to the search list. In step 488, the instruction line is added to the output report (e.g., the top of the output report).

TABLE IV

EXEMPLARY PSEUDO-CODE FOR BACKTRACE SCRIPT

```
BEGIN:
    searchlist = empty;
    currentline = read_line(inputline)
    for (each input parameter in currentline)
        add_input_parameter_to_searchlist( )
LOOP:
    read_inputs = FALSE
    if (inputline is not first line of file)
        currentline = read_previous_line( )
        for (each output parameter in currentline)
            if (any output parameter is in searchlist)
                remove_output_parameter_from_searchlist( )
                read_inputs = TRUE
                add_currentline_to_report( )
        if (read_inputs == TRUE)
            for (each input parameter in currentline)
                add_input_parameter_to_searchlist( )
        goto LOOP
```

TABLE IV-continued

EXEMPLARY PSEUDO-CODE FOR BACKTRACE SCRIPT

```
REPORT:
    print_report_lines( )
    for (each parameter in searchlist)
        print_initial_value_of_parameter( )
END
```

The automated method and system for backtracing of instruction parameters from a specified instruction in test cases can be utilized in both automatically-generated (also referred to as randomly-generated test cases) test cases and manually-generated test cases. The automated method and system for backtracing of instruction parameters from a specified instruction in test cases is especially useful for randomly-generated testcases because randomly-generated testcases tend to be created in large volumes, on the order of thousands per day. By automating the bactracing process, the automated method and system for backtracing of instruction parameters from a specified instruction in test cases saves the verification engineer's time previously required to manually perform the back tracing in the potentially high number of failing testcases.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A method for automatically backtracing through a testcase file comprising the steps of:
    a) accessing the testcase file;
    b) receiving a start line identifier;
    c) processing an instruction line in the testcase file that is specified by the start line identifier; and
    d) processing a previous instruction line in the testcase file until a beginning of the testcase file is reached.

2. The method of claim 1 wherein the step of processing the instruction line in the testcase file that is specified by the start line identifier includes the steps of:
    reading the testcase file;
    adding input parameters of the start line to a search list; and
    adding the start line to an output report.

3. The method of claim 2 wherein the step of processing a previous instruction line includes the steps of:
    d1) reading a previous instruction line;
    d2) determining whether the previous instruction line outputs to any parameter in the search list;
    d3) when the previous instruction line does not output to any parameter in the search list, determining whether there are more previous instruction lines in the testcase file;
    d4) when there are more previous instruction lines in the testcase file, proceeding to step (d1), where another previous instruction line is read from the testcase file.

4. The method of claim 3 wherein the step of determining whether there are more previous instruction lines in the testcase file includes the steps of:
    determining whether an instruction in the previous instruction line modifies any parameter in the search list; and
    when an instruction in the previous instruction line does not modify any parameter in the search list, determining whether there are more previous instruction lines in the testcase file.

5. The method of claim 1 wherein the step of accessing the testcase file includes the step of
    opening the testcase file.

6. The method of claim 1 wherein the start line identifier specifies a line in the testcase file that causes one of a fault expected by the testcase that is not taken by an RTL model simulator and architectural simulator and a fault not expected by the testcase that is taken by the RTL model simulator and architectural simulator.

7. A method for automatically backtracing through a testcase file comprising the steps of:
    a) evaluating an instruction entry in question;
    b) determining input parameters of the instruction entry in question and storing the input parameters in a search list;
    c) parsing through instruction entries in the testcase file until a most recent instruction entry that has an output that matches one of the input parameters in the search list is found;
    d) determining whether an earlier instruction in said most recent instruction entry affects a current instruction in said instruction entry in question;
    f) when an earlier instruction does not affect the current instruction, reporting one or more source instructions; and
    g) when an earlier instruction affects the current instruction, proceeding to step (c) to find a next most recent instruction entry.

8. The method of claim 7 wherein the step of determining the input parameters of the instruction entry in question and storing input parameters in a search list includes the step of:
    determining the input address registers of the instruction entry in question and storing the input address registers in the search list.

9. A testing system which includes a testcase file that includes a plurality of instructions, said system comprising:
    a) a source for generating a start line identifier; and
    b) a mechanism coupled to the source for accessing the testcase file and receiving a start line identifier and based on said start line identifier for automatically backtracing from the start line to the beginning of the testcase file and generating a report that includes at least one possible instruction location of failure.

10. The testing system of claim 9 wherein the source includes one of a verification engineer and a mechanism for automatically detecting unpredicted faults.

11. The testing system of claim 9 wherein the mechanism includes:
    a file access unit for accessing the testcase file.

12. The testing system of claim 9 wherein the mechanism includes:
    a start line processing unit for processing the start line; and
    a previous line processing unit for processing lines previous to the start line.

13. The testing system of claim 9 wherein the mechanism includes:
    a report generator for generating a report that includes information useful for debugging and analysis.

14. The testing system of claim 13 wherein the mechanism further includes:
  a search list that includes at least one search parameter;
  an instruction list that includes at least one instruction;
  wherein the report includes at least one instruction from the instruction list and at least one parameter from the search list.

15. The testing system of claim 9 wherein the mechanism includes:
  an instruction line point for tracking a current instruction line in the testcase file currently being processed.

* * * * *